United States Patent
Wang et al.

(10) Patent No.: US 8,836,447 B2
(45) Date of Patent: Sep. 16, 2014

(54) TUNER AND FRONT-END CIRCUIT THEREOF

(75) Inventors: Fucheng Wang, Hsinchu Hsien (TW);
Yi Lu, Hsinchu Hsien (TW);
Chung-Yun Chou, Hsinchu Hsien (TW)

(73) Assignee: MStar Semiconductor, Inc., Hsinchu Hsien (TW)

(*) Notice: Subject to any disclaimer, the term of this patent is extended or adjusted under 35 U.S.C. 154(b) by 1003 days.

(21) Appl. No.: 12/845,103

(22) Filed: Jul. 28, 2010

(65) Prior Publication Data

US 2011/0051014 A1 Mar. 3, 2011

(30) Foreign Application Priority Data

Sep. 2, 2009 (TW) ............................. 98129602 A

(51) Int. Cl.
*H04B 3/04* (2006.01)
*H03J 3/20* (2006.01)
*H03J 3/06* (2006.01)

(52) U.S. Cl.
CPC .... *H03J 3/06* (2013.01); *H03J 3/20* (2013.01)
USPC ........................................................ 333/17.1

(58) Field of Classification Search
USPC ........ 333/17.1; 455/179.1, 180.1, 149, 161.1, 455/164.2, 178.1, 192.2, 193.1, 193.2
See application file for complete search history.

(56) References Cited

U.S. PATENT DOCUMENTS

| | | | | |
|---|---|---|---|---|
| 4,462,010 A | * | 7/1984 | Strammello | 333/126 |
| 4,851,796 A | * | 7/1989 | Hendriks | 333/129 |
| 6,882,233 B2 | * | 4/2005 | Oh et al. | 331/117 R |
| 7,825,746 B2 | * | 11/2010 | Yeung et al. | 333/185 |
| 2008/0129610 A1 | * | 6/2008 | Tsfati et al. | 343/702 |

FOREIGN PATENT DOCUMENTS

| | | |
|---|---|---|
| EP | 1168607 A3 | 12/2005 |
| TW | 200518454 A | 6/2005 |
| TW | 200623626 A | 7/2006 |
| TW | 200814520 A | 3/2008 |
| TW | 200836497 A | 9/2008 |
| TW | 200901623 A | 1/2009 |
| TW | 200913697 A | 3/2009 |

OTHER PUBLICATIONS

J.J.F. Rijns, "CMOS Low-Distortion High-Frequency Variable-Gain Amplifier", Jul. 1996, vol. 31, No. 7, pp. 1029-1034, IEEE Journal of Solid-State Circuits.
Taiwan Intellectual Property Office, "Office Action", Mar. 20, 2013, Taiwan.

* cited by examiner

*Primary Examiner* — Robert Pascal
*Assistant Examiner* — Kimberly Glenn
(74) *Attorney, Agent, or Firm* — WPAT, PC; Justin King

(57) ABSTRACT

A tuner includes a plurality of paths, and at least one of the paths includes a front-end filter circuit, an amplifier, and a trace filter. The trace filter includes a varactor and an inductor, which are coupled to an output end of the amplifier. Further, the amplifier and the varactor of the tuner are packed in a complementary metal-oxide semiconductor (CMOS) chip.

17 Claims, 9 Drawing Sheets

US 8,836,447 B2

TUNER AND FRONT-END CIRCUIT THEREOF

CROSS REFERENCE TO RELATED PATENT APPLICATION

This patent application is based on Taiwan, R.O.C. patent application No. 98129602 filed on Sep. 2, 2009.

FIELD OF THE INVENTION

The present invention relates to a tuner, and more particularly, to a tuner of which partial or all components are packed in a single silicon chip and a front-end circuit of the tuner.

BACKGROUND OF THE INVENTION

In a TV system, one function of the tuner is to select a signal of a desired channel from a received broadband television (TV) signal, and perform subsequent signal processing on the selected signal of the desired channel. A conventional CAN tuner has a large volume. In addition, the tuner implements a trace filter with a capacitive/inductive filter as to select a desired frequency, with a capacitor of the trace filter being a varactor. However, since a broadband TV signal (i.e., the TV signal having a large frequency range) is to be processed by the tuner, the varactor correspondingly needs a large variable range, i.e., a high supply voltage (about 30 V) for driving the varactor.

A silicon tuner is developed to overcome the foregoing disadvantages of a CAN tuner with a large volume and a high supply voltage requirement for a varactor. Although a silicon tuner has advantages in having a small volume and a lower supply voltage requirement (about 3 V), transconductance values of components and noises need to be taken into consideration for that a trace filter of the silicon tuner, which is realized by an active device. Therefore, the silicon tuner needs to be produced by a bipolar junction transistor (BJT) manufacturing process. Yet, a silicon tuner manufactured by the BJT manufacturing process has a rather large area, and a production cost of the silicon tuner cannot be reduced since the BJT manufacturing process is more costly.

Furthermore, a conventional tuner has three front-end filter circuits, i.e., a low-pass filter circuit, a band-pass filter circuit, and a high-pass filter circuit. Due to the cost considerations, the three front-end circuits are implemented in one single chip by capacitors and inductors. As a result, the cost is reduced by the sacrifice of the filtering quality.

SUMMARY OF THE INVENTION

Therefore, one object of the present invention is to provide a tuner of which partial or all components are packed in a silicon chip, and having a low-cost front-end filter circuit with a high filtering quality to solve the foregoing problem.

According to an embodiment of the present invention, a front-end circuit of a tuner comprises a transformer and a plurality of paths. The transformer converts a single-end signal into a differential signal. The plurality of paths each comprises a filter circuit that are directly electrically connected to a node coupled to an output end of the transformer.

According to another embodiment of the present invention, a tuner comprises a plurality of paths, and at least one of the paths comprises a front-end filter circuit, a differential amplifier, and a trace filter. The trace filter comprises a varactor and an inductor, which are coupled to two output ends of the differential amplifier. In addition, the amplifier and the varactor of the tuner are packed in a complementary metal-oxide semiconductor (CMOS) chip.

According to another embodiment of the present invention, a tuner comprises a plurality of paths, each of which comprises a front-end filter circuit, a differential amplifier and a trace filter. The trace filter comprises a varactor and an inductor, which are coupled to two output ends of the differential amplifier. In addition, the amplifier and the varactor are packed in a single chip, and the inductor is externally connected to the chip.

A tuner and a front-end circuit thereof according to the present invention are capable of reducing a production cost while maintaining a preferable filtering quality.

DETAILED DESCRIPTION OF THE PREFERRED EMBODIMENT

Figure 1:
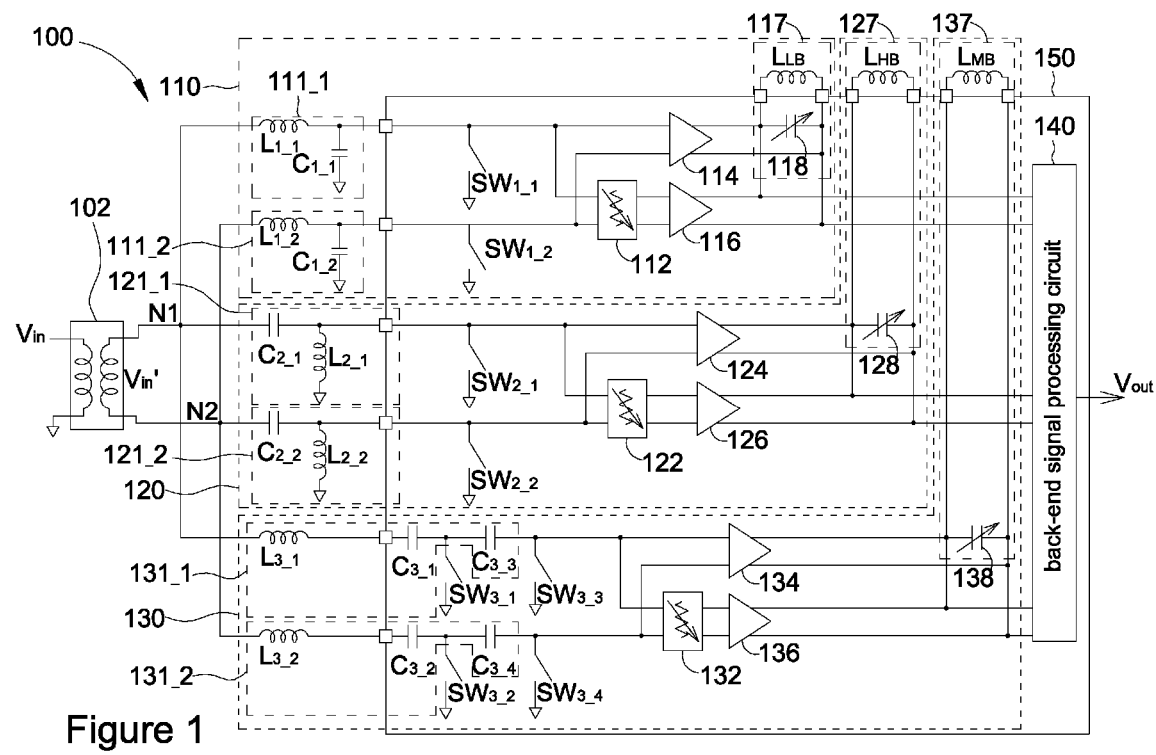
FIG. 1 is a schematic diagram of a TV tuner in accordance with an embodiment of the present invention.

Refer to FIG. 1 showing a schematic diagram of a TV tuner 100 in accordance with an embodiment of the present invention. The TV tuner 100 comprises a transformer 102, a first path 110, a second path 120, a third path 130, and a back-end signal processing circuit 140. The first path 110 comprises two low-pass filter circuits 111_1 and 111_2, two switches $SW_{1\_1}$ and $SW_{1\_2}$, an attenuator 112, two low-noise amplifiers 114 and 116, and a trace filter 117. The second path 120 comprises two high-pass filter circuits 121_1 and 121_2, two switches $SW_{2\_1}$ and $SW_{2\_2}$, an attenuator 122, two low-noise amplifiers 124 and 126, and a trace filter 127. The third path 130 comprises two band-pass filter circuit 131_1 and 131_2, four switches $SW_{3\_1}$, $SW_{3\_2}$, $SW_{3\_3}$ and $SW_{3\_4}$, an attenuator 132, two low-noise amplifiers 134 and 136, and a trace filter 137. In addition, the low-pass filter circuit 111_1 comprises an inductor $L_{1\_1}$ and a capacitor $C_{1\_1}$. The low-pass filter circuit 111_2 comprises an inductor $L_{1\_2}$ and a capacitor $C_{1\_2}$. The high-pass filter circuit 121_1 comprises a capacitor $C_{2\_1}$ and an inductor $L_{2\_1}$; the high-pass filter circuit 121_2 comprises a capacitor $C_{2\_2}$ and an inductor $L_{2\_2}$; the band-pass filter circuit 131_1 comprises an inductor $L_{3\_1}$ and two capacitors $C_{3\_1}$ and $C_{3\_3}$; the band-pass filter circuit 131_2 comprises an inductor $L_{3\_2}$ and two capacitors $C_{3\_2}$ and $C_{3\_4}$; the trace filter 117 comprises an inductor $L_{LB}$ and a varactor 118; the trace filter 127 comprises an inductor $L_{HB}$ and a varactor 128; and the trace filter 137 comprises an inductor $L_{MB}$ and a varactor 138.

In addition, the TV tuner 100 in FIG. 1 is fabricated on a printed circuit board (PCB), and the switches $SW_{1\_1}$, $SW_{1\_2}$, $SW_{2\_1}$, $SW_{2\_2}$, $SW_{3\_1}$, $SW_{3\_2}$, $SW_{3\_3}$, $SW_{3\_4}$, the capacitors $C_{3\_1}$, $C_{3\_3}$, $C_{3\_2}$, and $C_{3\_4}$, the attenuators 112, 122 and 132, the amplifiers 114, 116, 124, 126, 134, and 136, the varactors 118, 128, and 138 and the back-end signal processing circuit 140 are packed in a single chip 150. In this embodiment, the chip 150 is a CMOS chip. In addition, the low-pass filter circuits 111_1 and 111_2, the high-pass filter circuits 121_1 and 121_2 and the inductors $L_{3\_1}$, $L_{3\_2}$, $L_{LB}$, $L_{HB}$, $L_{MB}$, externally connected to the chip 150, are off-the-shelf components.

The tuner 100 in FIG. 1 is illustrated as an embodiment of the present invention. In another embodiment, at least one of the inductors $L_{LB}$, $L_{HB}$ and $L_{MB}$ is packed in the single chip 150. In yet another embodiment, partial or all components of the low-pass filter circuit 111_1 and 111_2, the high-pass filter circuit 121_1 and 121_2 or band-pass filter circuit 131_1 and 131_2 may be packed in the single chip 150, instead of being externally connected to the chip 150 as shown in FIG. 1. Further, the capacitor $C_{3\_3}$ of the band-pass filter circuit 131_1, the capacitor $C_{3\_4}$ of the band-pass filter circuit 131_2, and the switches $SW_{3\_3}$ and $SW_{3\_4}$ are removed from the tuner 100 in FIG. 1 while leaving operations of the tuner 100 unaffected, as such modifications are within the spirit and scope of the present invention.

One function of the TV tuner 100 is to select a signal of a desired channel from a broadband TV signal Vin having a frequency range of 48 MHz to 850 MHz, and perform subsequent signal processing on the selected signal. For example, a user selects a channel having a center frequency of 200 MHz by using a remote control, the TV tuner 100 filters the TV signal Vin to output signals having frequencies approximate to 200 MHz from the TV signal Vin to the back-end signal processing circuit 140 that then performs subsequent signal processing on the output signals.

The filtering process of the TV tuner 100 is divided to two stages—a first stage of the filtering process is a front-end filtering operation and a second stage of the filtering process is a trace filtering operation. The first stage process, the front-end filtering operation, is performed by the low-pass filter circuits 111_1 and 111_2, the high-pass filter circuits 121_1 and 121_2, or the band-pass filter circuit 131_1 and 131_2. In the front-end filtering operation, a low-pass, high-pass, or band-pass filtering is performed on the broadband TV signal Vin to generate a low-pass filtered TV signal, a high-pass filtered TV signal, or a band-pass filtered TV signal, which respectively comprises a plurality of TV channel signals. The second stage process, the trace filtering operation, is performed by the trace filters 117, 127, and 137. In the trace filtering operation, a trace filtering is performed on the low-pass filtered TV signal, the high-pass filtered TV signal, or the band-pass filtered TV signal to generate a single TV channel signal. For example, the trace filter 137 performs trace filtering on the band-pass filtered TV signal to obtain a TV signal of a channel having a center frequency of 200 MHz. Under normal circumstances, the trace filtering may be performed in conjunction with a surface acoustic wave (SAW) filter for removing signals having neighboring frequencies to a frequency of a target channel to generate the TV signal of a single channel.

It is to be noted that, the low-pass filter circuit 111_1, the high-pass filter circuit 121_1, and the band-pass filter circuit 131_1 are directly electrically connected to an output node $N_1$ of the transformer 102; and the low-pass filter circuit 111_2, the high-pass filter circuit 121_2 and the band-pass filter circuit 131_2 are directly electrically connected to an output node $N_2$ of the transformer 102. In other words, no other components (e.g., switches) are connected between the node $N_1$ and the low-pass filter circuit 111_1, the high-pass filter circuit 121_1, and the band-pass filter circuit 131_1. Similarly, no other components are connected between the node $N_2$ and the low-pass filter circuit 111_1, the high-pass filter circuit 121_1, and the band-pass filter circuit 131_1. The nodes $N_1$ and $N_2$ are a pair of differential output nodes of the transformer 102. In other embodiments of the present invention, the nodes $N_1$ and $N_2$ can be coupled to a single output of the transformer 102, i.e., there may be other components between the nodes $N_1$ and $N_2$ and the transformer 102.

Figure 2A:
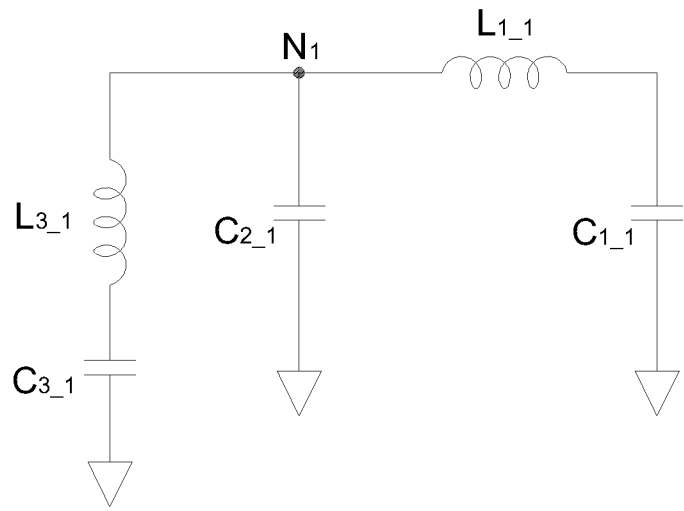
FIGS. 2a and 2b are a schematic diagram of a front-end circuit of a tuner equivalent to a low-pass filter circuit when a user-selected channel is a low frequency channel.
Figure 2B:
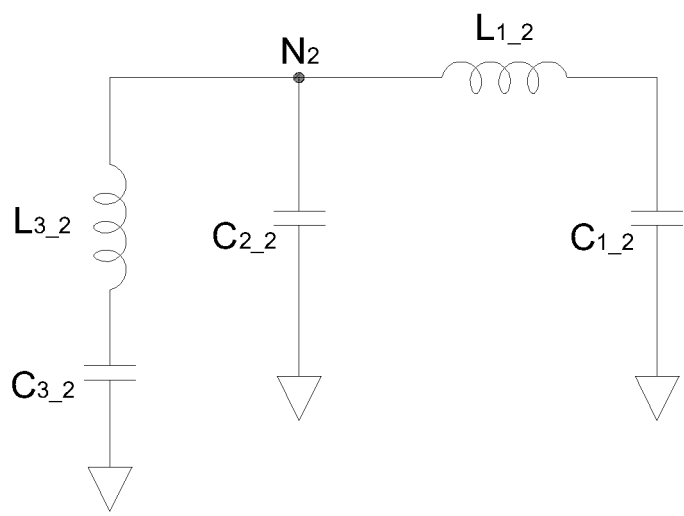
Figure 3:
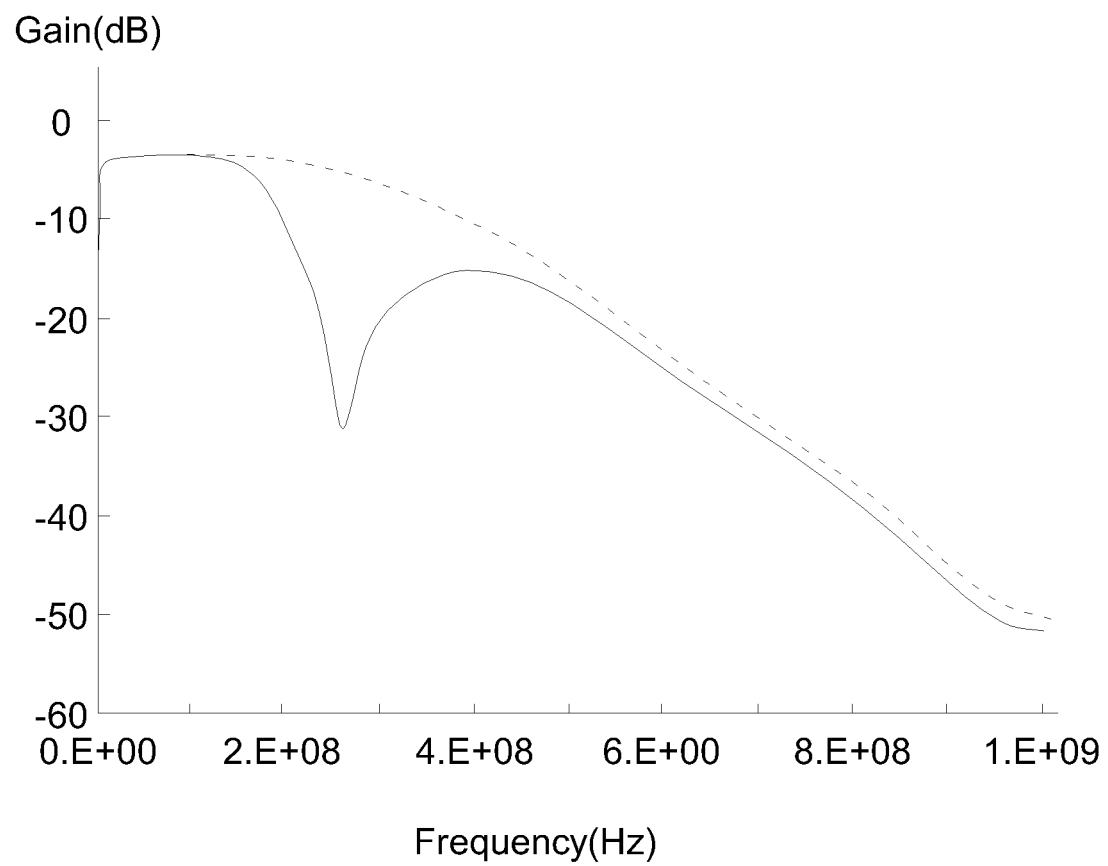
FIG. 3 is schematic diagram of comparing transmission functions of the low-pass filter circuit in FIG. 2 and a low-pass filter circuit in FIG. 1.

Operations of the tuner 100 are to be described below. According to a user-selected channel, the tuner 100 determines whether to enable the amplifiers 114, 116, 124, 126, 134 and 136, and whether to close the switches $SW_{1\_1}$, $SW_{1\_2}$, $SW_{2\_1}$, $SW_{2\_2}$, $SW_{3\_1}$, $SW_{3\_2}$, $SW_{3\_3}$ and $SW_{3\_4}$. For example, supposing that the selected channel has a center frequency of 80 MHz, i.e., the selected channel is a low-frequency channel with respect to the tuner 100 (i.e, the first path 110 is applied to filter a transformed TV signal Vin' to select the channel), the tuner 100 disables the amplifiers 124 and 126 of the second path 120, and the amplifiers 134 and 136 of the third path 130. That is to say, for the transformed TV signal Vin, the amplifiers 124 and 126 of the second path 120, and the amplifiers 134 and 136 of the third path 130 have relatively large impedances. Therefore, without weakening intensity of the transformed TV signal Vin, the low-pass filter circuit 111_1 and 111_2 performs low-pass filtering on the transformed TV signal Vin to obtain a desired signal. In addition, at this point, the tuner 100 closes the switches $SW_{2\_1}$, $SW_{2\_2}$, $SW_{3\_1}$, $SW_{3\_2}$, $SW_{3\_3}$ and $SW_{3\_4}$ and opens the switches $SW_{1\_1}$ and $SW_{1\_2}$. Since the switches $SW_{2\_1}$, $SW_{2\_2}$, $SW_{3\_1}$, $SW_{3\_2}$, $SW_{3\_3}$ and $SW_{3\_4}$ are closed, the second path 120 and the third path 130 connect to ground. Accordingly, a front-end of the tuner 100 forms two low-pass filter circuits as shown in FIGS. 2a and 2b, and the two low-pass filter circuits in FIGS. 2a and 2b having higher orders than that of the low-pass filter circuits 111_1 and 111_2 alone; thus improve a low-pass filter quality of the tuner. Refer to FIG. 3 showing a schematic diagram illustrating comparison between transmission functions (frequency responses) of the low-pass filter circuit in FIGS. 2a, 2b, and the low-pass filter circuit 111_1. A solid line represents a transmission function of the low-pass filter circuit in FIGS. 2a and 2b, and a dashed line represents a transmission function of the low-pass filter circuit 111_1. A difference between the two transmission functions is that the transmission function of the low-pass filter circuit in FIGS. 2a and 2b has a notch at an intermediate-frequency (IF) part, meaning that intermediate-frequency components are significantly attenuated and thereby improving the quality of the low-pass filtering.

Figure 4A:
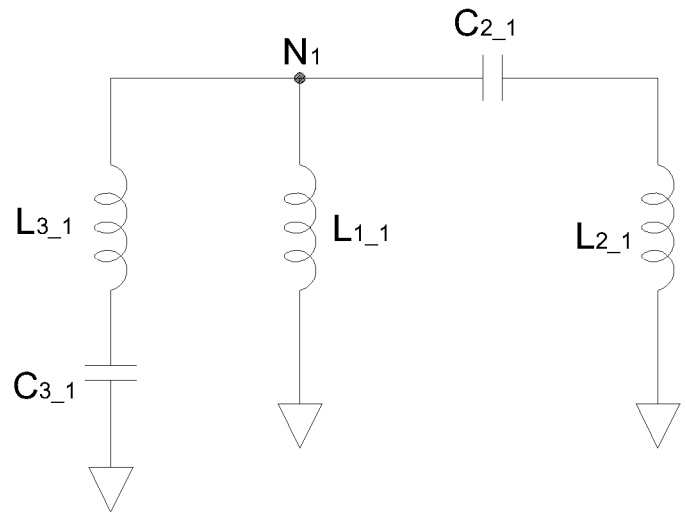
FIGS. 4a and 4b are a schematic diagram of a schematic diagram of a front-end circuit of a tuner equivalent to a high-pass filter circuit.
Figure 4B:
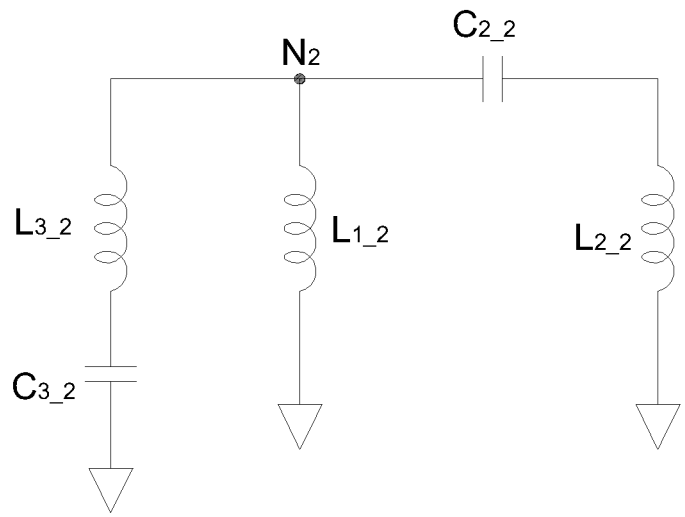
Figure 5:
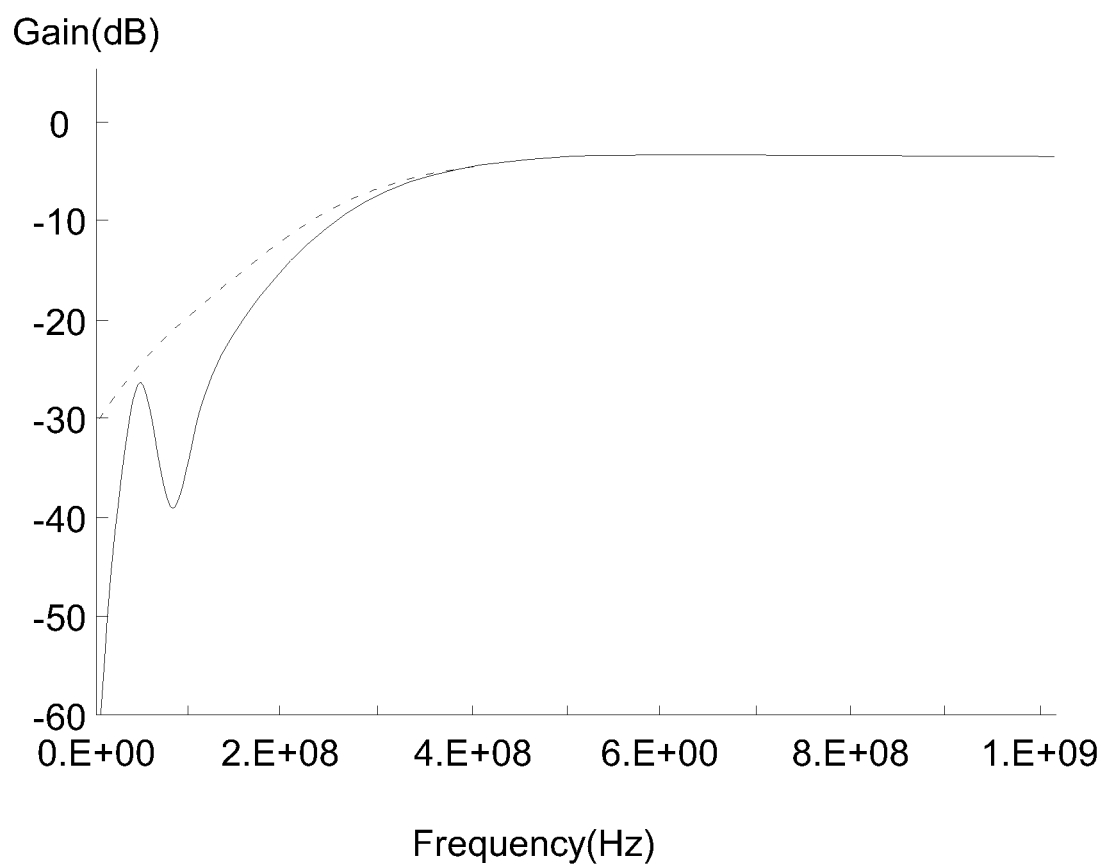
FIG. 5 is a schematic diagram of comparison between transmission functions of the high-pass filter circuit in FIG. 4 and the high-pass filter circuit in FIG. 1.

Taking the user-selected channel having a center frequency 750 MHz as an example, the user-selected channel is a high frequency (HF) channel with respect to the tuner 100 (i.e., the second path 120 is applied to filter the transformed TV signal Vin' to select the channel). The tuner 100 disables the amplifiers 114 and 116 of the first path 110, and the amplifiers 134 and 136 of the third path 130. That is to say, for the transformed TV signal Vin, the amplifiers 114 and 116 of the first path 110 and the amplifiers 134 and 136 of the third path 130 have relatively large impedances. Therefore, without weakening intensity of the transformed TV signal Vin, the high-pass filter circuit 121_1 and 121_2 of the second path 120 performs high-pass filtering on the transformed TV signal Vin to obtain a desired signal. In addition, the tuner 100 closes the switches $SW_{1\_1}$, $SW_{1\_2}$, $SW_{3\_1}$, $SW_{3\_2}$, $SW_{3\_3}$ and $SW_{3\_4}$ and opens the switches $SW_{2\_1}$ and $SW_{2\_2}$. Since the switches $SW_{1\_1}$, $SW_{1\_2}$, $SW_{3\_1}$, $SW_{3\_2}$, $SW_{3\_3}$ and $SW_{3\_4}$ are closed, the second path 110 and the third path 130 connect to ground. Accordingly, a front-end of the tuner 100 forms two high-pass filter circuits shown in FIGS. 4a and 4b, and the two high-pass filter circuits in FIGS. 4a and 4b have higher orders than that of the high-pass filter circuits 121_1 and 121_2 alone, thus improve the quality of the high-pass filtering of the tuner. Refer to FIG. 5 showing a schematic diagram of comparing transmission functions (frequency responses) of the high-pass filtering in FIG. 4 and the high-pass filter circuit 121_1. A solid line represents a transmission function of the high-pass filter circuit in FIG. 4, and a dashed line represents a transmission function of the high-pass filter circuit 121_1. A difference between the two transmission functions is that the transmission function of the high-pass filter circuit in FIG. 4 has a notch (referring to FIG. 5) at a low frequency part, meaning that low frequency components are significantly attenuated and thereby improving the high-pass filtering quality.

Yet taking the user-selected channel with a center frequency 300 MHz as an example, the user-selected channel is an intermediate-frequency channel for the tuner 100 (i.e., the third path 130 is applied to filter the transformed TV signal Vin to select the channel). The tuner 100 disables the amplifiers 114 and 116 of the first path 110, and the amplifiers 124 and 126 of the second path 120. That is to say, for the transformed TV signal Vin, the amplifiers 114 and 116 of the first path 110 and the amplifiers 124 and 126 of the second path 120 have relatively large impedances. Therefore, without weakening intensity of the transformed TV signal Vin, the band-pass filter circuit 131_1 and 131_2 of the third path 130 performs band-pass filtering on the transformed TV signal Vin to obtain a desired signal. In addition, the tuner 100 closes the switches $SW_{1\_1}$, $SW_{1\_2}$, $SW_{2\_1}$ and $SW_{2\_2}$ and opens the switches $SW_{3\_1}$ and $SW_{3\_2}$, $SW_{3\_3}$ and $SW_{3\_4}$. Since the switches $SW_{1\_1}$, $SW_{1\_2}$, $SW_{2\_1}$ and $SW_{2\_2}$ are closed, the second path 110 and the third path 120 connect to ground. Accordingly, a front-end of the tuner 100 forms two band-pass filter circuits shown in FIGS. 6a and 6b, and the two high-pass filter circuits in FIGS. 6a and 6b have higher orders than that of the high-pass filter circuits 131_1 and 131_2 alone, thus improve a band-pass filtering quality of the tuner. Refer to FIG. 7 showing a schematic diagram illustrating comparison between transmission functions (frequency responses) of the band-pass filter circuit in FIG. 6 and the band-pass filter circuit 131_1. A solid line represents a transmission function of the band-pass filter circuit in FIG. 6, and a dashed line represents a transmission function of the band-pass filter circuit 131_1. A difference between the two transmission functions is that the transmission function of the band-pass filter circuit in FIG. 6 has a relatively large bandwidth (referring to FIG. 7), meaning that intermediate-frequency components are significantly attenuated and thereby improving the quality of the band-pass filtering.

It is appreciated from the description associated with FIG. 2 to FIG. 7 that, in this embodiment of the present invention, although the low-pass filter circuits 111_1 and 111_2, the high-pass filter circuit 121_1 and 121_2, and the band-pass filter circuit 131_1 and 131_2 are implemented by simple components, a preferable filtering quality is achieved with the original filter circuits using filter circuit components of other paths through controlling operations of the amplifiers 114, 116, 124, 126, 134, and 136, and opening/closing of the switches $SW_{1\_1}$, $SW_{1\_2}$, $SW_{2\_1}$, $SW_{2\_2}$, $SW_{3\_1}$, $SW_{3\_2}$, $SW_{3\_3}$ and $SW_{3\_4}$. More specifically, taking the low-pass filter circuit 111_1, the high-pass filter circuit 121_1, and the band-pass filter circuit 131_1 as an example, the low-pass filter circuit 111_1 of the first path 110, the capacitor $C_{2\_1}$ of the second path 120, and the inductor $L_{3\_1}$ and the capacitor $C_{3\_1}$ of the third path 130 form a high-order low-pass filter circuit in FIG. 2 since the switches $SW_{2\_1}$, $SW_{2\_2}$, $SW_{3\_1}$, $SW_{3\_2}$, $SW_{3\_3}$ and $SW_{3\_4}$ are closed when the user-selected channel is the low-frequency channel. The high-pass filter circuit 121_1 of the second path 120, the inductor $L_{1\_1}$ of the first path 110 and the inductor $L_{3\_1}$ and the capacitor $C_{3\_1}$ of the third path 130 form a high-order high-pass filter circuit in FIG. 4 since the switches $SW_{1\_1}$, $SW_{1\_2}$, $SW_{3\_1}$, $SW_{3\_2}$, $SW_{3\_3}$ and $SW_{3\_4}$ are closed when the use-selected channel is the high-frequency channel. Furthermore, the band-pass filter circuit 131_1 of the third path 130, the inductor $L_{1\_1}$ of the first path 110, and the capacitor $C_{2\_1}$ of the second path 120 form a high-order band-pass filter circuit in FIG. 6 since the switches $SW_{1\_1}$, $SW_{1\_2}$, $SW_{3\_1}$, $SW_{3\_2}$, $SW_{3\_3}$ and $SW_{3\_4}$ are closed when the user-selected channel is the intermediate-frequency channel. Therefore, in this embodiment of the present invention, the preferable filtering quality is achieved by using low-cost filter circuits.

The front-end filter circuit of the tuner 110 (e.g., the filter circuit in FIGS. 2a-b, FIGS. 4a-b, or FIGS. 6a-b) is used for filtering the transformed TV signal Vin to generate a filtered signal. After that, the filtered signal is first processed by the amplifier 114, 116, 124, 126, 134, or 136, and is then processed by the trace filter 117, 127, or 137 to select a desired channel. More specifically, when the user-selected channel has a low center frequency (e.g., 80 MHz), the transformed TV signal Vin is filtered by the low-pass filter circuit in FIGS. 2a and 2b to generate a low-pass filtered signal. When the amplitude (i.e., intensity) of the low-pass filtered signal is too large, the tuner 100 disables the amplifier 114, so as to first attenuate the intensity of the low-pass filtered signal by the attenuator 112, and then to amplify the attenuated low-pass filtered signal by the amplifier 116 to prevent from saturating the amplifier 116. In contrast, when the intensity of the low-pass filtered signal is within an allowable range, the amplifier 116 is disabled, and the low-pass filtered signal is directly amplified by the amplifier 114. After that, the trace filter 117 performs trace filtering on an output signal or the amplifier 114 or 116 to select the desired channel. The back-end processing circuit 140 performs back-end signal processing on an output signal of the trace filter 117 to generate an output signal Vout.

For operations of the trace filter 117, the tuner 100 determines a capacitance value of a varactor 118 of the trace filter 117 according to the user-selected channel, so that the output signal of the trace filter 117 has an accurate frequency (i.e., the center frequency of the user-selected channel). The capacitance value of the varactor 118 corresponding to each of channels is automatically determined before the system becomes stable (e.g., when booting up the TV). For example, supposing that the first path 110 is for outputting signals of 50 channels to the back-end signal processing circuit 140, before the system becomes stable, the tuner 100 detects and determines 50 capacitance values of the varactor 118, so that the trace filter 117 is able to accurately output the signals of the 50 channels according to the 50 capacitance values.

Figure 8:
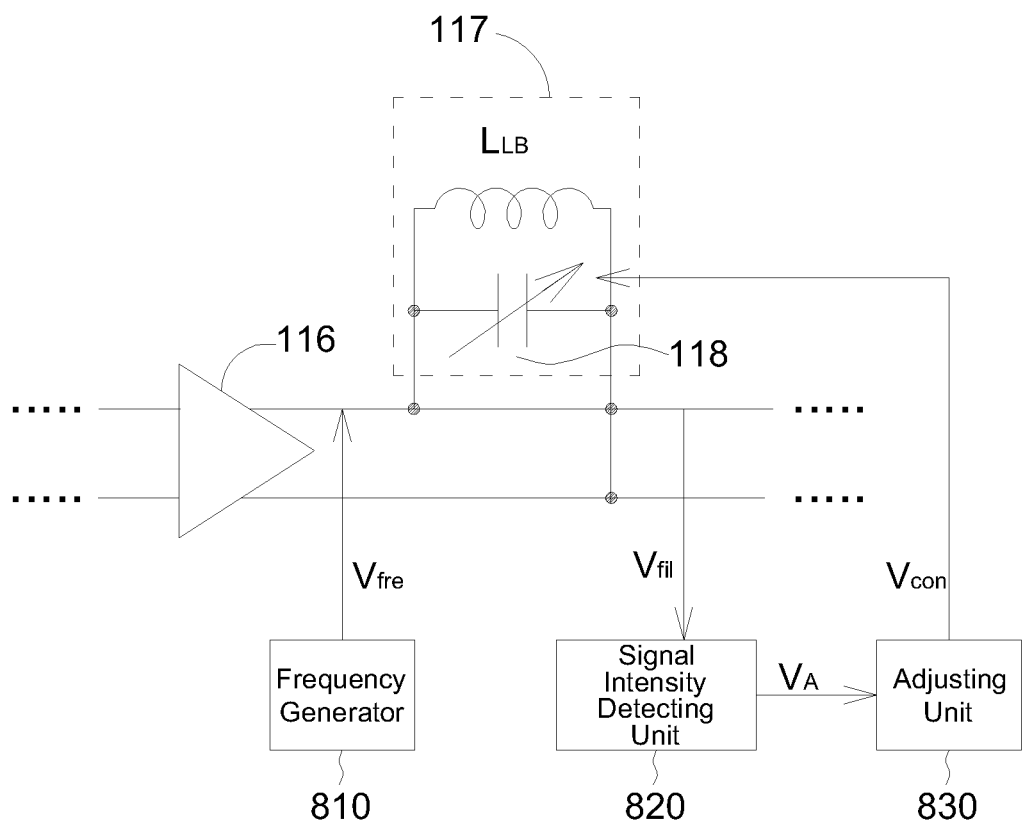
FIG. 8 is a schematic diagram of an arrangement for automatically detecting a capacitance value that a varactor has for each channel.

In addition, in an embodiment of the present invention, an approach for automatically determining the capacitance value of the varactor 118 for each channel is described below. Refer to FIG. 8 showing a schematic diagram of an arrangement for automatically detecting the capacitance value of the varactor 118 for each channel. As shown in FIG. 8, a frequency generator 810 is coupled to an input end of the trace filter 117, a signal intensity detecting unit 820 is coupled to an output end of the trace filter 117, and an adjusting unit 830 is coupled between the signal intensity detecting unit 820 and the varactor 118. The frequency generator 810, the signal intensity detecting unit 820 and the adjusting unit 830 are packed in the single chip 150.

Figure 9:
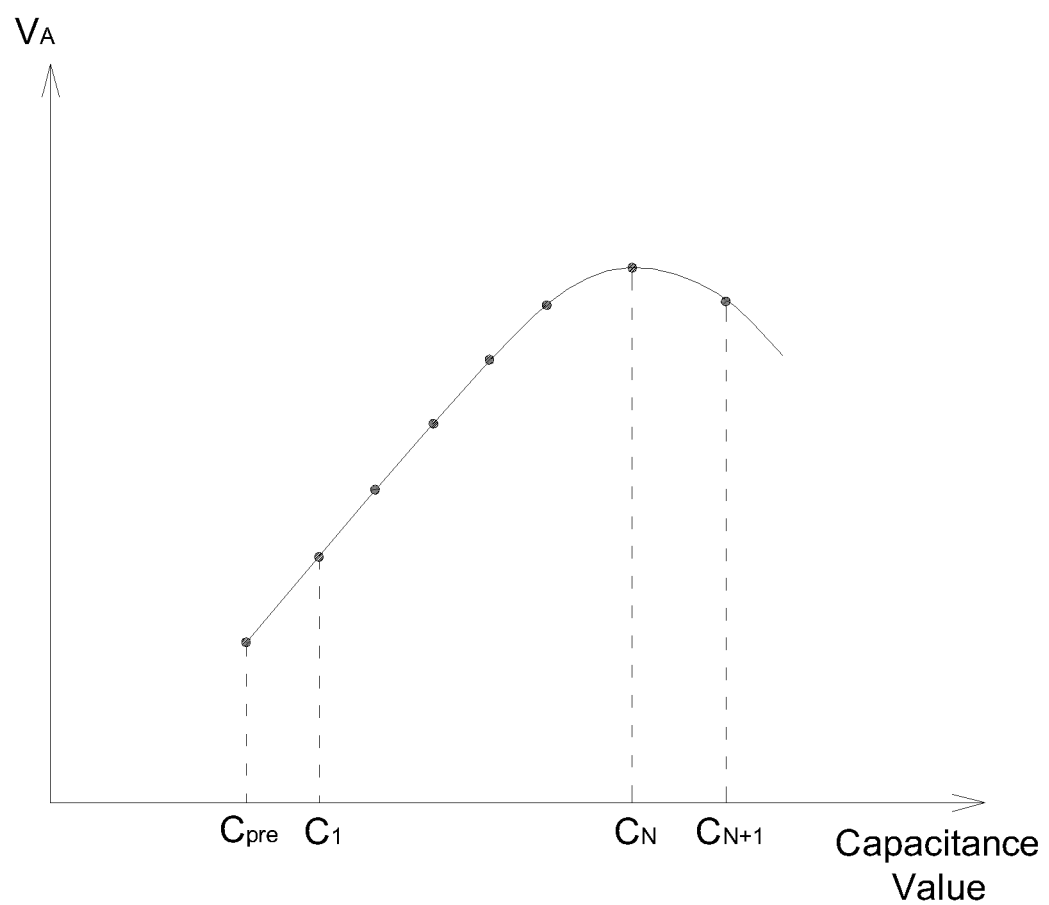
FIG. 9 is a diagram showing a curve representing a capacitance value of a varactor and an intensity signal outputted by a signal intensity detecting unit.

Following description is given with reference to FIG. 8 and FIG. 9. FIG. 9 shows a diagram of a curve representing a capacitance value of the varactor 118 and an intensity signal outputted by the signal intensity detecting unit 820 when the tuner 100 begins to detect the capacitance value of the varactor 118 corresponding to each channel. It is to be noted that, FIG. 9 is an example for illustrating the tuner 100 detecting the capacitance value of the varactor 118 of each channel, and shall not be construed as limiting the spirit of the present invention. To detect the capacitance value of the varactor 118 corresponding to each of channels, the tuner 100 first disables the amplifiers 114 and 116, and at this point, the varactor 118 has a predetermined capacitance value (i.e., $C_{pre}$ in FIG. 9). The frequency generator 810 then generates an adjustment signal $V_{fre}$ having a predetermined frequency to the input end of the trace filter 117. The predetermined frequency of the adjustment signal Vfre is selected from a plurality of predetermined frequencies, which are a plurality of center frequencies corresponding to a plurality of TV channels of a TV system. For example, supposing that the tuner 100 is used to detect a capacitance value of the varactor 118 corresponding to a channel with a center frequency of 50 MHz, the frequency generator 810 shall generate an adjustment signal $V_{fre}$ according to the frequency of 50 MHz to the output end of the trace filter 117.

When the adjustment signal $V_{fre}$ reaches the input end of the trace filter 117, the trace filter 117 filters the adjustment signal $V_{fre}$ to generate a filtered adjustment signal $V_{fil}$. The signal intensity detecting unit 8

20 then detects an intensity value of the filtered adjustment signal $V_{fil}$ to generate an intensity signal $V_A$. Next, the adjusting unit 830 adjusts a capacitance value of the varactor 118 according to the intensity signal $V_A$ (e.g., in the embodiment in FIG. 9, the capacitance value of the varactor 118 is adjusted to $C_1$).

After the adjusting unit 830 adjusts the capacitance value of the varactor 118 according to the intensity signal $V_A$, the trace filter 117 constantly filters the adjustment signal $V_{fre}$ to generate the filtered adjustment signal $V_{fil}$, and the signal intensity detecting unit 820 also constantly detects the intensity value of the filtered adjustment signal $V_{fil}$ to generate the intensity signal $V_A$. In addition, the adjusting unit 830 constantly adjusts the capacitance value of the varactor 118 until the intensity value (i.e., the intensity signal $V_A$) of the filtered adjustment signal $V_{fil}$ filtered by the signal intensity detecting unit 820 is determined as a maximum intensity value. Referring to FIG. 9, the intensity value $V_A$ of the filtered adjustment signal $V_{fil}$ is determined as the maximum intensity value when the varactor 118 has a capacitance value $C_N$. Therefore, supposing that the frequency of the adjustment signal $V_{fre}$ is 50 MHz, the capacitance value of the varactor 118 corresponding to the channel with the center frequency of 50 MHz is $C_N$ (i.e., when the user-selected channel has the center frequency 50 MHz, the capacitance value of the varactor 118 switches to $C_N$).

It is to be noted that, there are various types of methods for determining a capacitance value of the varactor 118 corresponding to the maximum intensity signal $V_A$, and FIG. 9 shows an example of a mountain-climbing search method. However, in other embodiments of the present invention, other search methods (e.g., a binary search method) are applied to search for a capacitance value of the varactor 118 corresponding to the maximum intensity signal $V_A$, as modifications are within the spirit and scope of the present invention.

Following description refers back to the process performed on the filtered signal by the amplifier 114, 116, 124, 124, 134 or 136, and the description of selecting a desired channel by the trace filter 117, 127, or 137. Likewise, with respect to the second path 120, supposing that the user-selected channel has a high-frequency center frequency, the high-pass filter circuit in FIGS. 4a and 4b filters the transformed TV signal Vin to generate a high-pass filtered signal. After that, when the amplitude (i.e., intensity) of the high-pass filtered signal is too large, the tuner 110 disables the amplifier 124, so as to first attenuate the intensity of the high-pass filtered signal by the attenuator 122, and then to amplify the high-pass filtered signal by the amplifier 126 as to prevent it from saturating the amplifier 126. In contrast, when the intensity of the high-pass filtered signal is within an allowable range, the tuner 110 disables the amplifier 126 to directly amplify the high-pass filtered signal by the amplifier 124. After that, the trace filter 127 performs trace filtering on an output signal of the amplifier 124 or 126 to select a desired channel signal, and the back-end processing circuit 140 performs back-end signal processing on the output channel of the trace filter 137 signal to generate an output signal Vout.

The trace filter 127 and the adjustment for determining the capacitance value of the varactor 128 are extremely similar to the trace filter 117 and the adjustment of the varactor 118 in the foregoing description, and a person skilled in the art may easily know operations of the trace filter 127 and the varactor 128 from the foregoing description associated with the trace filter 117 and the varactor 118, such that details thereof shall not be described for brevity.

Figure 6A:
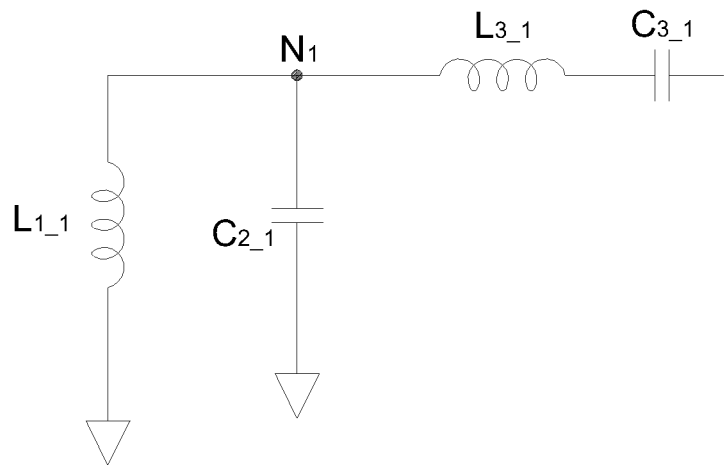
FIGS. 6a and 6b are a schematic diagram of a front-end circuit of a tuner equivalent to a band-pass filter circuit.
Figure 6B:
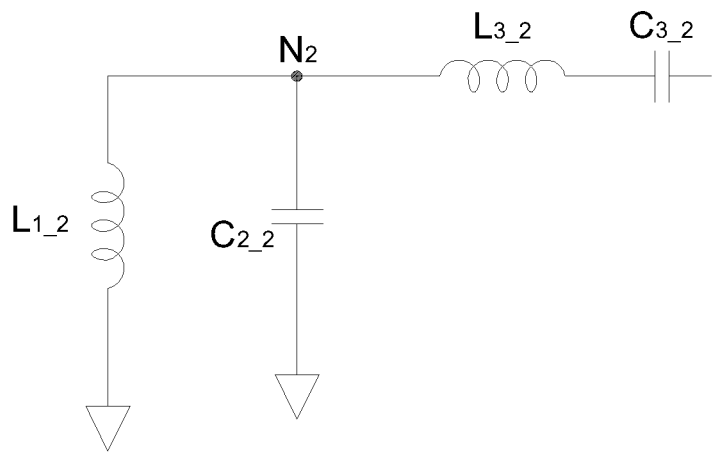
Figure 7:
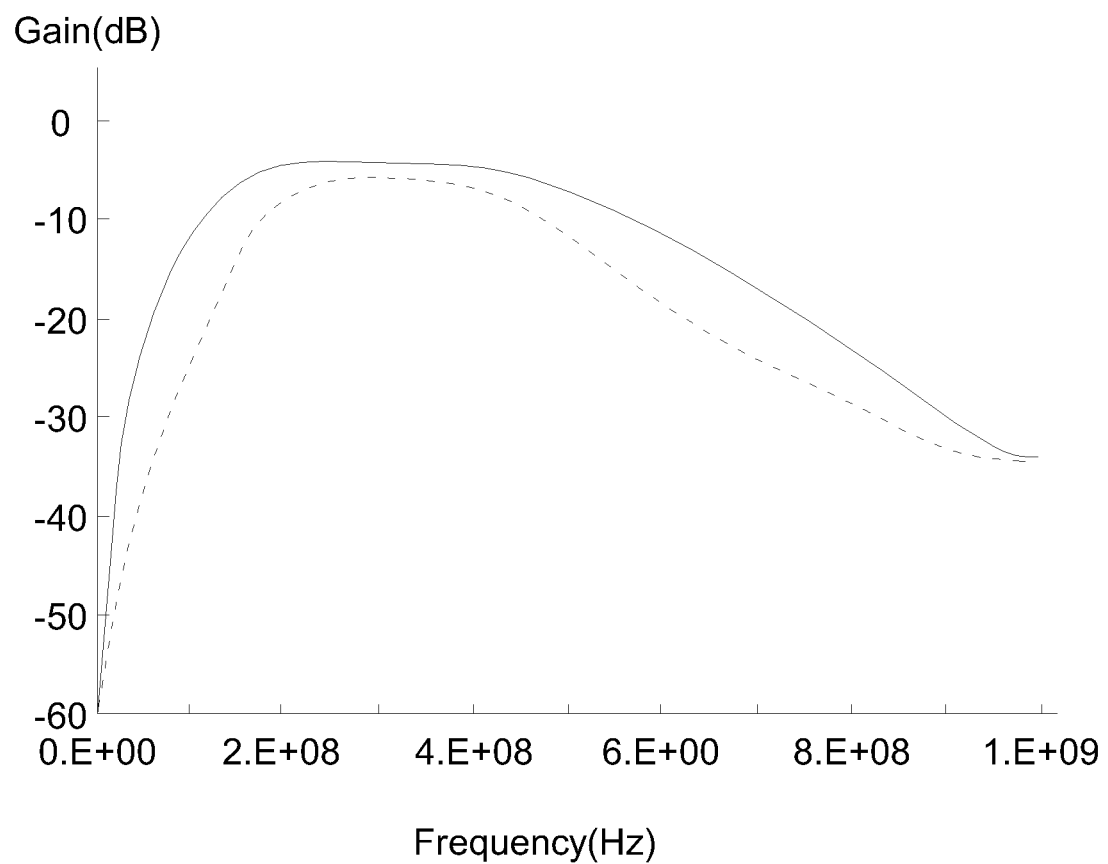
FIG. 7 is a schematic diagram of comparison between transmission functions of the band-pass filter circuit in FIG. 6 and a band-pass filter circuit in FIG. 1.

Similarly, with respect to the third path 130, supposing that the user-selected channel has an intermediate-frequency center frequency, the band-pass filter circuit in FIGS. 6a and 6b filters the transformed TV signal Vin to generate a band-pass filtered signal. After that, when a amplitude (i.e., intensity) of the high-pass filtered signal is too large, the tuner 110 disables the amplifier 134, so as to first attenuate the intensity of the band-pass filtered signal by the attenuator 132, and then to amplify the band-pass filtered signal by the amplifier 136 to avoid saturation of the amplifier 136. In contrast, when the intensity of the band-pass filtered signal is within an allowable range, the tuner 110 disables the amplifier 136 to directly amplify the band-pass filtered signal by the amplifier 134. After that, the trace filter 137 performs trace filtering on an output signal of the amplifier 134 or 136 to select a desired channel signal, and the back-end processing circuit 140 performs back-end signal processing on the output channel signal of the trace filter 137 to generate an output signal Vout.

The trace filter 137 and adjustment for determining the capacitance value of the varactor 138 are extremely similar to the trace filter 117 and the adjustment of the varactor 118 in the foregoing description, and a person skilled in the art may easily know operations of the trace filter 137 and the varactor 138 from the foregoing description associated with the trace filter 117 and the varactor 118, such that details thereof shall not be described for brevity.

In another embodiment of the present invention, each of the first path 110, the second path 120, and the third path 130 may comprise only one amplifier, i.e., either the amplifier 114 or the amplifier 116 is removed from the first path 110 (when the amplifier 116 is removed, the attenuator 112 is together removed), either the amplifier 124, or the amplifier 126 is removed from the second path 120 (i.e., when the amplifier 126 is removed, the attenuator 122 may also be removed), and either the amplifier 134 or the amplifier 136 is removed from the first path 130 (when the amplifier 136 is removed, the attenuator 132 is together removed), as such modifications are within the spirit of the present invention.

In addition, the tuner 100 in FIG. 1 has a fully differential configuration, i.e., the transformer 102 outputs a differential signal, and each of the first path 110, the second path 120, and the third path 130 comprises two filter circuits to filter the differential signal (i.e., the transformed TV signal Vin' in FIG. 1). An object of the fully differential configuration of the tuner 100 is to reduce noise coupling and harmonic distortion. In other embodiments of the present invention, the tuner 100 applies a single-end configuration to reduce cost, i.e., the low-pass filter circuit 111_1, the high-pass filter circuit 121_2 and the band-pass filter circuit 131_2 are removed from the tuner 100. A person skilled in the art may easily design the tuner 10 as the single-end configuration after reading the foregoing operations of the tuner 10, and details thereof shall not be described for brevity.

In conclusion, by applying simple components at a front-end of a tuner according to the present invention, a preferable filtering quality is achieved. In addition, partial components of the tuner are packed in a single chip, so that the tuner is given a smaller volume and a lower production cost.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A tuning circuit, comprising:
    a transformer, for converting a single-end signal to a differential signal;
    a first path, comprising a first filter circuit;
    a second path, comprising a second filter circuit; and
    a third path, comprising a third filter circuit;
    wherein, the first filter circuit, the second filter circuit and the third filter circuit are electrically connected to an output end of the transformer, the first filter circuit is a low-pass filter, the second filter circuit is a high-pass filter, and the third filter circuit is a band-pass filter.

2. The tuning circuit as claimed in claim 1, wherein the first filter circuit comprises:
    a first inductor, directly coupled to the output end of the transformer; and
    a first capacitor, coupled between the first inductor and a reference voltage;
    the second filter circuit comprises:
    a second capacitor, directly coupled to the output end of the transformer; and
    a second inductor, coupled between the second capacitor and the reference voltage; and
    the third filter circuit comprises:
    a third inductor, directly coupled to the output end of the transformer; and
    a third capacitor, coupled between the third inductor and an output end of the third filter circuit.

3. The tuning circuit as claimed in claim 2, wherein the first path further comprises a first switch coupled between the first inductor and the reference voltage; the second path further comprises a second switch coupled between the second capacitor and the reference voltage; and the third channel further comprises a third switch coupled between the third inductor and the reference voltage.

4. The tuning circuit as claimed in claim 3, wherein when the tuning circuit is selecting a channel, only one of the first switch, the second switch, and the third switch is open.

5. The tuning circuit as claimed in claim 3, wherein the first switch, the second switch, and the third switch are packed in a single chip, and the first inductor, the second inductor, and the third inductor are externally connected to the chip.

6. The tuning circuit as claimed in claim 5, wherein the third capacitor is packed in the single chip, and the first capacitor and the second capacitor are externally connected to the chip.

7. A tuner, comprising:
    a first path;
    a second path, comprising:
        a front-end filter circuit;
        a differential amplifier, coupled to the front-end filter circuit;
        an attenuator, coupled between the front-end filter circuit and the differential amplifier; and
        a trace filter, comprising:
            a varactor, coupled to two output ends of the differential amplifier, and
            an inductor, coupled to the varactor in parallel;
    wherein the amplifier and the varactor are integrated in a complementary metal-oxide semiconductor (CMOS) chip.

8. The tuner as claimed in claim 7, further comprises a transformer for converting a single-end signal to a differential signal; wherein the first path further comprises a first filter circuit, and the first filter circuit is electrically connected to an output end of the transformer.

9. The tuner as claimed in claim 7, wherein the inductor is packed in the CMOS chip.

10. The tuner as claimed in claim 7, further comprising:
    a frequency generator, coupled to an input end of the trace filter, for providing an adjustment signal to the trace filter, wherein the adjustment signal has a first frequency and the trace filter filters the adjustment signal to generate a filtered adjustment signal;
    a signal intensity detecting unit, coupled to the trace filter, for detecting an intensity value of the filtered adjustment signal; and
    an adjusting unit, coupled to the signal intensity detecting unit, for adjusting a capacitance value of the varactor according to the intensity value of the filtered adjustment signal.

11. The tuner as claimed in claim 10, wherein the adjusting unit constantly adjusts the capacitance value of the varactor until the intensity value of the filtered adjustment signal detected by the signal intensity detecting unit is determined as a maximum intensity value.

12. The tuner as claimed in claim 10, wherein the frequency generator selects the first frequency from a plurality of predetermined frequencies to generate the adjustment signal, and the plurality of predetermined frequencies is a plurality of center frequencies corresponding to a plurality of television (TV) channels of a TV system.

13. A tuner, comprising:
a plurality of paths, at least one of the paths comprising:
- a front-end filter circuit;
- an amplifier, coupled to the front-end filter circuit;
- an attenuator, coupled between the front-end filter circuit and the amplifier; and
- a trace filter, comprising:
    - a varactor, coupled to a ground end and an output end of the amplifier; and
    - an inductor, coupled to the varactor in parallel;
wherein, the amplifier and the varactor are integrated in a single chip, and the inductor is externally connected to the chip.

14. The tuner as claimed in claim 13, wherein the front-end filter circuit further comprising:
a first filter circuit;
wherein the first filter circuit is directly electrically connected to a node.

15. The tuner as claimed in claim 13, wherein the path further comprising:
a frequency generator, coupled to an input end of the trace filter, for providing an adjustment signal to the trace filter, wherein the adjustment signal comprises a first frequency, the trace filter filters the adjustment signal to generate a filtered adjustment signal;
a signal intensity detecting unit, coupled to the trace filter, for detecting an intensity value of the filtered adjustment signal; and
an adjusting unit, coupled to the signal intensity detecting unit, for adjusting a capacitance value of the varactor according to the intensity value of the filtered adjustment signal.

16. The tuner as claimed in claim 15, wherein the adjusting unit constantly adjusts the capacitance value of the varactor until the intensity value of the filtered adjustment signal detected by the signal intensity detecting unit is determined as a maximum intensity value.

17. The tuner as claimed in claim 15, wherein the frequency generator selects the first frequency from a plurality of predetermined frequencies to generate the adjustment signal, and the plurality of predetermined frequencies is a plurality of center frequencies corresponding to a plurality of TV channels of a TV system.

* * * * *